US012585194B2

(12) United States Patent
Doetzel et al.

(10) Patent No.: US 12,585,194 B2
(45) Date of Patent: Mar. 24, 2026

(54) METHOD AND SWAPPING TOOL

(71) Applicant: Carl Zeiss SMT GmbH, Oberkochen (DE)

(72) Inventors: Eugen Doetzel, Ulm (DE); Johannes Kruis, Oberkochen (DE); Benjamin Sigel, Aalen (DE); Dietmar Duerr, Dettingen (DE); Tobias Hegele, Aalen (DE); Alexander Ostendorf, Langenau (DE); Sebastian Henseler, Aalen (DE); Christian Beyrle, Aalen (DE); Christian Werner, Beek en Donk (NL); Alexander Kaniut, Remshalden (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 213 days.

(21) Appl. No.: 18/332,192

(22) Filed: Jun. 9, 2023

(65) Prior Publication Data

US 2023/0400772 A1     Dec. 14, 2023

(30) Foreign Application Priority Data

Jun. 13, 2022    (DE) ......................... 102022205972.7

(51) Int. Cl.
| | | |
|---|---|---|
| *G03F 7/20* | (2006.01) | |
| *G02B 27/62* | (2006.01) | |
| *G03F 7/00* | (2006.01) | |
| *G21K 1/06* | (2006.01) | |

(52) U.S. Cl.
CPC ......... *G03F 7/70258* (2013.01); *G02B 27/62* (2013.01); *G21K 1/06* (2013.01)

(58) Field of Classification Search
CPC ............. G03F 7/70258; G03F 7/70825; G03F 7/70975; G02B 27/62; G21K 1/06
See application file for complete search history.

(56) References Cited

U.S. PATENT DOCUMENTS

| | | | |
|---|---|---|---|
| 2002/0163631 A1 | 11/2002 | Sogard | |
| 2007/0177122 A1 | 8/2007 | Loopstra et al. | |
| 2008/0174758 A1* | 7/2008 | Gellrich | .............. G03F 7/70308 355/67 |
| 2009/0244509 A1* | 10/2009 | Limbach | .............. G03F 7/70308 355/67 |
| 2018/0297213 A1 | 10/2018 | Haruna et al. | |

FOREIGN PATENT DOCUMENTS

DE     10 2021 208 624 A1     3/2022

OTHER PUBLICATIONS

Office Action in German Appln. No. DE 102022205972.7, mailed on Oct. 25, 2022, 8 pages (with English translation).

* cited by examiner

*Primary Examiner* — Mesfin T Asfaw
(74) *Attorney, Agent, or Firm* — Fish & Richardson P.C.

(57) ABSTRACT

A method for swapping an optical system, such as a DUV mirror, of a projection exposure apparatus, comprises: a) raising the optical system along a centre axis of the optical system so that mount struts of the optical system pass out of contact with frame struts of a frame carrying the optical system; b) rotating the optical system about the centre axis so that the mount struts are arranged between the frame struts; c) lowering the optical system along the centre axis; and d) shifting the optical system perpendicularly to the centre axis so that the optical system is moved out of a housing.

21 Claims, 12 Drawing Sheets

METHOD AND SWAPPING TOOL

CROSS-REFERENCE TO RELATED APPLICATIONS

This application claims benefit under 35 U.S.C. § 119 to German Application No. DE 10 2022 205 972.7, filed Jun. 13, 2022. The contents of this application is hereby incorporated by reference in its entirety.

FIELD

The present disclosure relates to a method for swapping an optical system of a projection exposure apparatus and to a swapping tool for swapping the optical system.

BACKGROUND

Microlithography is used for producing microstructured component parts, such as for example integrated circuits. The microlithography process is performed with a lithography apparatus, which has an illumination system and a projection system. The image of a mask (reticle) illuminated via the illumination system is in this case projected via the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are DUV lithography apparatuses (deep ultraviolet, DUV) that use light with a wavelength in the range of 30 nm to 250 nm, for example 193 nm. In the case of such DUV lithography apparatuses, reflective optical units, that is to say mirrors, can be used instead of, as hitherto, refractive optical units, that is to say lens elements.

It is generally desirable to be able to swap mirrors of this type at the use location of such a DUV lithography apparatus. Due to the confined space conditions and the tolerances to be observed when swapping a mirror of this type, this can be associated with a large outlay in terms of time and labour and therefore is often not practical at the use location of the DUV lithography apparatus.

SUMMARY

The present disclosure seeks to provide an improved method for swapping an optical system.

Accordingly, a method for swapping an optical system, for example a DUV mirror, of a projection exposure apparatus, is proposed. The method comprises the following steps: a) raising the optical system along a centre axis of the optical system in such a manner that mount struts of the optical system pass out of contact with frame struts of a frame carrying the optical system, b) rotating the optical system about the centre axis in such a manner that the mount struts are arranged between the frame struts, c) lowering the optical system along the centre axis, and d) shifting the optical system perpendicularly to the centre axis in such a manner that the optical system is moved out of a housing.

Owing to the fact that the optical system is rotated and then lowered, it is possible to move the optical system out of the housing without a collision between the mount struts and the frame struts even when space conditions are confined. This makes an interference-free swapping of the optical system possible.

The optical system can be part of a projection optical unit of the projection exposure apparatus. In this case, the housing can also be part of the projection optical unit. The housing may be referred to as a system housing. The housing may be referred to, for example, as a mirror housing. In this case, the optical system can be a mirror. However, the housing may also be referred to as a lens element housing. In this case, the optical system can be a lens element. The optical system is suitable for DUV lithography. However, the optical system can also be suitable for EUV lithography. DUV stands for "deep ultraviolet" and denotes a wavelength of the working light of between 30 nm and 250 nm. EUV stands for "extreme ultraviolet" and denotes a wavelength of the working light of between 0.1 nm and 30 nm.

The optical system is a mirror, such as a DUV mirror. The optical system can accordingly be a mirror or a mirror module or may be referred to as such. Alternatively, the optical system can also be a lens element. For example, the optical system can be what is referred to as a Half Dome Mirror (HDM), such as a deformable Half Dome Mirror (dHDM).

A coordinate system having a first spatial direction or x direction, a second spatial direction or y direction and a third spatial direction or z direction can be assigned to the optical system. The x direction may also be referred to as an x axis, the y direction may also be referred to as a y axis, and the z direction may also be referred to as a z axis.

The centre axis can be oriented parallel to the z direction or can coincide therewith. Accordingly, the optical system is raised along the z direction during step a) and lowered counter to the z direction during step c). The optical system is correspondingly rotated about the z direction during step b). The shifting of the optical system during step d) takes place perpendicularly to the z direction and along the x direction.

The optical system can be constructed substantially rotationally symmetrically to the centre axis. The optical system has an optical element. The optical element can be a mirror or a lens element. It is assumed below that the optical element is a mirror. In addition to the optical element, the optical system has a mount which carries the optical element.

In the event that the optical system is a dHDM, it can have actuators or actuating elements, with the aid of which the optical element is deformable in order to modify or to influence optical properties of the optical element. In this case, the optical system is actuable. In the method, a non-actuable HDM (static or solid Half Dome Mirror, sHDM) can be swapped for an actuable dHDM. However, an sHDM can also be swapped for another sHDM or a dHDM for another dHDM.

A plurality of mount struts are arranged on the mount. Three mount struts which are attached to the mount in a manner distributed uniformly about the centre axis can be provided. For example, precisely three mount struts which are offset by 120° to one another are provided. The mount struts are referred to as "A struts" or may be referred to as such. Each mount strut comprises two arm sections which are arranged at an inclination to each other. The arm sections can comprise joints, for example what are referred to as flexures.

The optical system is assigned six spatial points which are implemented with the aid of six frame struts. A pose of the optical system in space is defined with the aid of the six spatial points. Each frame strut forms a spatial point. In each case two frame struts are assigned to one mount strut. Accordingly, in each case one frame strut is assigned to one arm section of a respective mount strut. The frame on which the frame struts are provided can be what is referred to as a manipulator frame.

The optical system has six degrees of freedom, namely three linear or translational degrees of freedom along the x direction, the y direction and the z direction, respectively, and three rotational degrees of freedom about the x direction, the y direction and the z direction, respectively. In other words, a position and an orientation of the optical system can be determined or described with the aid of the six degrees of freedom.

The "position" of the optical system should be understood to mean in particular its coordinates in relation to the x direction, the y direction and the z direction. The "orientation" of the optical system is to be understood to mean in particular its tilt with respect to the three directions. In other words, the optical system can be tilted about the x direction, the y direction and/or the z direction.

This gives the six degrees of freedom for the position and the orientation of the optical system. The "pose" of the optical system comprises both its position and its orientation. The term "pose" is accordingly replaceable by the wording "position and orientation" and vice versa. Accordingly, the pose of the optical system within the housing is realized by the six frame struts which define six spatial points that define the pose of the optical element. The pose of the optical system can be adjusted during the method. "Adjustment" or "alignment" should be understood here to mean that the pose of the optical system is changed. For example, the optical system can be moved from an actual pose into a target pose.

The method may also be referred to as a method for dismounting the optical system. During step b), the optical system is rotated about the centre axis or about the z direction such that the mount struts are placed above the frame struts and between the frame struts, as viewed along the z direction. During step c), the optical system is then lowered along the centre axis or counter to the z direction in such a manner that the mount struts are placed level or approximately level with the frame struts, but between the frame struts, such that no contact between the mount struts and the frame struts is achieved.

For example, the optical system is raised by 10 mm along the centre axis or the z direction during step a). During step b), the optical system is rotated, for example, by −43.5° about the centre axis or the z direction. The lowering of the optical system during step c) takes place along the centre axis and counter to the z direction, wherein the optical system is optionally not lowered as far as a position which the optical system had before step a). In step d), the optical system is moved out of the housing of the optical system optionally along the x direction and thus perpendicularly to the centre axis or perpendicularly to the z direction. For this purpose, the housing has a corresponding opening.

According to one embodiment, during step c), the optical system is lowered to such an extent that the optical system is arranged, as viewed along the centre axis, in a position which differs from a position of the optical system before step a).

For example, the optical system is lowered during step c) into a position which, as viewed along the z direction, is arranged above the position in which the optical system is located before step a). For example, the optical system before step a) is located at a height of 0 mm, as viewed along the z direction. During step c), the optical system is then lowered, for example, from the previously mentioned height of 10 mm to a height of approximately 0.7 mm, as viewed along the z direction.

According to a further embodiment, the method further comprises the following steps: e) swapping the optical system for a further optical system, f) shifting the further optical system perpendicularly to a centre axis of the further optical system in such a manner that the further optical system is moved into the housing, g) raising the further optical system along the centre axis, h) rotating the further optical system about the centre axis in such a manner that mount struts of the further optical system are arranged above the frame struts, and i) lowering the further optical system along the centre axis in such a manner that the mount struts enter into contact with the frame struts.

A "further optical system" should be understood here, in contrast to the previously mentioned optical system, to mean another optical system which is installed instead of the optical system first mentioned. This further optical system is optionally not structurally identical to the optical system first mentioned. The optical system first mentioned can be an sHDM which is swapped for the further optical system in the form of a dHDM. That is to say that the further optical system which is integrated can have component parts which the optical system mentioned first does not have. However, the mounts and/or the mount struts of the optical system and of the further optical system can be structurally identical or identical. However, it is also possible for a dHDM to be swapped for another dHDM. In this last-mentioned case, the optical system and the further optical system are actually structurally identical. That is to say for example that, in the last-mentioned case, the optical system and the further optical system are not differentiated from each other in terms of their design. The further optical system can also be referred to as an optical swapping system, optical change system or optical swapping module. The aforementioned optical system may also be referred to as first optical system and the further optical system may also be referred to as second optical system. In step d), the optical system which has been moved out of the housing is replaced by the further optical system. Subsequently, according to steps f) to i), the further optical system is installed in the housing. In step h), the further optical system is rotated about the centre axis or the z direction in such a manner that the mount struts of the further optical system are arranged above the frame struts, as viewed along the z direction. In step i), the mount struts are then lowered onto the frame struts such that the mount struts come to lie on the frame struts.

According to a further embodiment, after step i), the further optical system is raised along the centre axis in such a manner that the mount struts pass out of contact with the frame struts, wherein the further optical system is subsequently lowered along the centre axis in such a manner that the mount struts enter again into contact with the frame struts.

The raising of the further optical system can cause possible stresses frozen in the joints of the frame struts to be relaxed. The subsequent placing again of the further optical system then can take place with better accuracy.

According to a further embodiment, after step i) and before the further optical system is raised, a connection between the optical system and a swapping tool is released such that the mount struts are automatically positioned on the frame struts.

The swapping tool can comprise a clamping device which is designed to grip an adapter block mounted on the further optical system. The clamping device can be released.

According to a further embodiment, the connection between the further optical system and the swapping tool is restored before the further optical system is raised.

For this purpose, the clamping device can be closed again. As soon as the clamping device is closed again, the optical system can be raised with the aid of the swapping tool.

According to a further embodiment, before step a), a pose of the optical system is detected, wherein the detected pose of the optical system is transmitted to the further optical system before step e).

To detect the pose of the optical system, the swapping tool has a sensor arrangement comprising a plurality of sensors. The further optical system is positioned on the swapping tool in such a manner that the pose of the further optical system to be installed corresponds to the pose of the optical system removed from the housing.

According to a further embodiment, before step i), a pose of the further optical system is adjusted with the aid of the swapping tool.

As previously mentioned, "adjustment" or "alignment" can be understood here to mean that the further optical system is moved from its actual pose into its target pose, or vice versa. The adjustment takes place with the aid of the swapping tool.

Furthermore, a swapping tool for swapping an optical system, for example a DUV mirror, of a projection exposure apparatus, is proposed. The swapping tool comprises an xyz carrier for raising and lowering the optical system along a centre axis of the optical system, an rz carrier for rotating the optical system about the centre axis, and an x frame for shifting the optical system perpendicularly to the centre axis.

The swapping tool is suitable for example for use on a DUV lithography apparatus. However, the swapping tool is also usable on an EUV lithography apparatus. The optical system can be translationally positioned along the x direction, the y direction and the z direction with the aid of the xyz carrier. With the aid of the rz carrier it is possible to carry out a rotational movement of the optical system about the centre axis or about the z direction. With the aid of the x frame the optical system can be moved perpendicularly to the centre axis and along the x direction.

According to an embodiment, the xyz carrier and the rz carrier are designed to adjust the optical system in six degrees of freedom.

As mentioned previously, the optical system comprises the six degrees of freedom. With the aid of the xyz carrier and the rz carrier it is possible to adjust all six degrees of freedom. For example, four of the degrees of freedom are actively adjustable, namely translationally along the x direction, the y direction and the z direction, respectively, and rotationally about the z direction, wherein two rotational degrees of freedom are adjustable passively, by alignment of the swapping tool, namely about the y direction and the z direction, respectively.

According to a further embodiment, the x frame carries the xyz carrier, wherein the xyz carrier carries the rz carrier.

The x frame can comprise linear guides, for example in the form of guide rails, along which the xyz carrier is linearly guided. The rz carrier is mounted on the xyz carrier. The rz carrier comprises guide rails which are curved in the form of circular arcs and on which a connection body is displaceably mounted. The connection body is connected to the optical system via the previously mentioned adapter block.

According to a further embodiment, the swapping tool furthermore has an adapter block which is connectable to the optical system.

The adapter block can be screwed to the optical system. The adapter block has a plurality of sensors which interact with sensor targets of the optical system in order to detect the pose of the optical system.

According to a further embodiment, the rz carrier has a clamping device for releasably connecting the rz carrier to the adapter block.

For example, after step i) and before the further optical system is raised, the clamping device is released so as to release the connection between the optical system and the swapping tool such that the mount struts can be positioned on the frame struts.

According to a further embodiment, the clamping device has clamping arms, wherein the clamping arms are supported on a connection body of the rz carrier with the aid of leaf springs.

The leaf springs prevent sagging and therefore tilting of the optical system about the y direction during the swapping of the optical system. The optical system can therefore be positioned more precisely. As previously mentioned, the y direction may also be referred to as the y axis.

According to a further embodiment, the swapping tool furthermore has a sensor arrangement for detecting a pose of the optical system.

The sensor arrangement can have any desired number of a wide variety of different sensors. For example, at least some of the sensors are provided in or on the adapter block.

"A" or "an" in the present case should not necessarily be understood to be restrictive to exactly one element. Rather, a plurality of elements, such as for example two, three or more, may also be provided. Any other numeral used here should also not be understood to the effect that there is a restriction to exactly the stated number of elements. Rather, unless indicated otherwise, numerical deviations upwards and downwards are possible.

The embodiments and features described for the method apply correspondingly to the proposed swapping tool, and vice versa.

Further possible implementations of the disclosure also comprise not explicitly mentioned combinations of features or embodiments that are described above or hereinafter with respect to the exemplary embodiments. In this case, a person skilled in the art will also add individual aspects as improvements or supplementations to the respective basic form of the disclosure.

Further configurations and aspects of the disclosure are the subject matter of the dependent claims and also of the exemplary embodiments of the disclosure described hereinafter.

BRIEF DESCRIPTION OF THE DRAWINGS

The disclosure is explained in greater detail hereinafter on the basis of embodiments with reference to the appended figures.

DETAILED DESCRIPTION

Unless indicated otherwise, elements that are identical or functionally identical have been provided with the same reference signs in the figures. It should also be noted that the illustrations in the figures are not necessarily true to scale.

Figure 1:
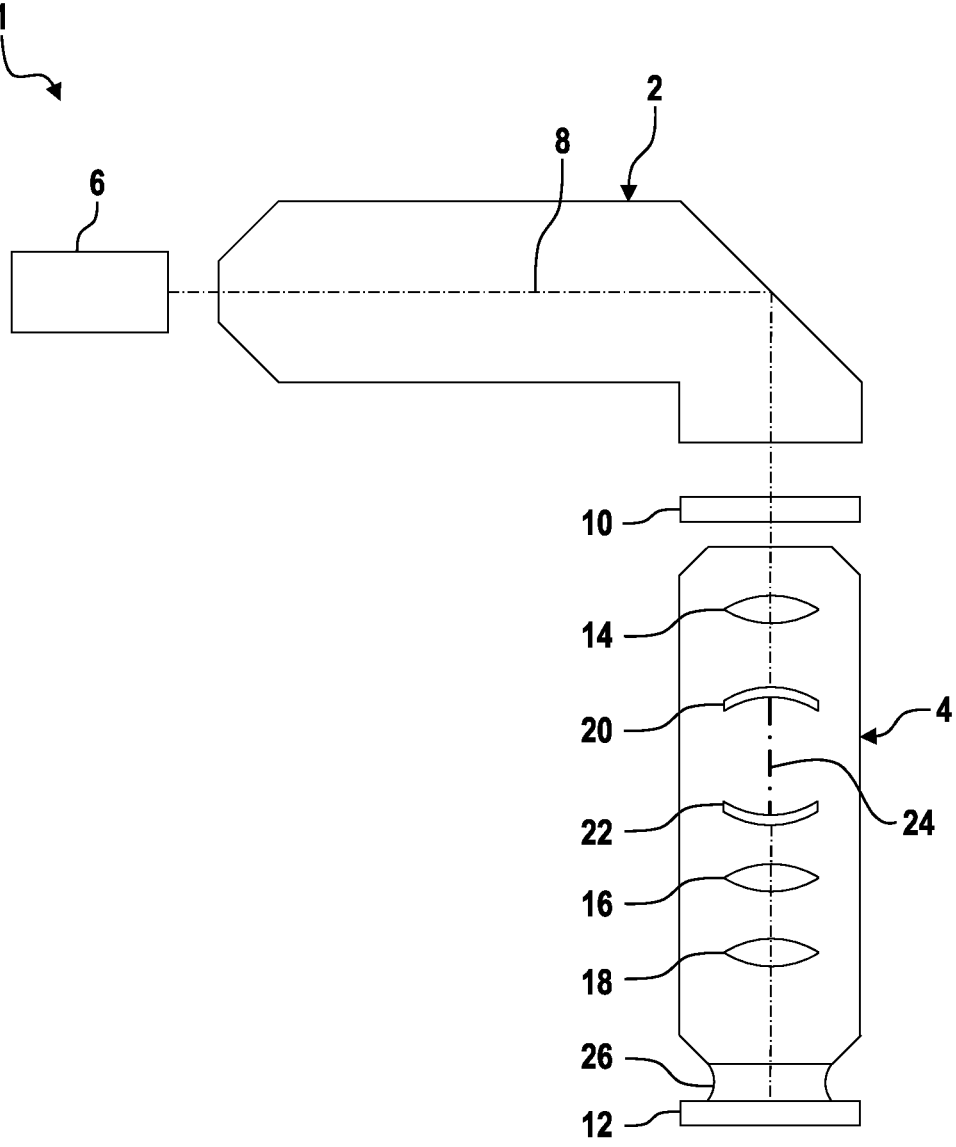
FIG. 1 shows a schematic view of an embodiment of a projection exposure apparatus for DUV projection lithography.

FIG. 1 shows a schematic view of a projection exposure apparatus 1, for example of a DUV lithography apparatus which comprises a beam-shaping and illumination system 2 (also referred to here as "illumination optical unit") and a projection optical unit 4 (also referred to here as "projection lens"). In this case, DUV stands for "deep ultraviolet" and denotes a wavelength of the working light of between 30 nm and 250 nm.

The beam-shaping and illumination system 2 and the projection optical unit 4 can each be arranged in a vacuum housing (not shown). Each vacuum housing is evacuated with the aid of an evacuation device (not illustrated). The vacuum housings are surrounded by a machine room (not illustrated), in which driving apparatuses for mechanically moving or adjusting optical elements can be provided. Furthermore, electrical controllers and the like may also be arranged in the machine room.

The projection exposure apparatus 1 has a light source 6. For example, an ArF excimer laser that emits radiation 8 in the DUV range, at for example 193 nm, may be provided as the light source 6. In the beam-shaping and illumination system 2, the radiation 8 is focused and the desired operating wavelength (working light) is filtered out from the radiation 8. The beam-shaping and illumination system 2 can have optical elements (not illustrated), such as, for example, mirrors or lens elements.

After passing through the beam-shaping and illumination system 2, the radiation 8 is guided onto a photomask, or reticle 10. The photomask 10 is formed as a transmissive optical element and can be arranged outside the beam-shaping and illumination system 2 and the projection optical unit 4. The photomask 10 has a structure which is imaged on a wafer 12 in reduced form via the projection optical unit 4.

The projection optical unit 4 has a plurality of lens elements 14, 16, 18 and/or mirrors 20, 22 for projecting an image of the photomask 10 onto the wafer 12. In this case, individual lens elements 14, 16, 18 and/or mirrors 20, 22 of the projection optical unit 4 can be arranged symmetrically relative to an optical axis 24 of the projection optical unit 4. It should be noted that the number of lens elements 14, 16, 18 and mirrors 20, 22 shown here is purely by way of example and is not restricted to the number shown. A greater or lesser number of lens elements 14, 16, 18 and/or mirrors 20, 22 can also be provided.

An air gap between a last lens element (not shown) and the wafer 12 can be replaced by a liquid medium 26 which has a refractive index of >1. The liquid medium 26 can be high-purity water, for example. Such a set-up is also referred to as immersion lithography and has an increased photolithographic resolution. The medium 26 can also be referred to as an immersion liquid.

Figure 2:
FIG. 2 shows a schematic plan view of an embodiment of an optical system for the projection exposure apparatus in accordance with FIG. 1.
Figure 2:
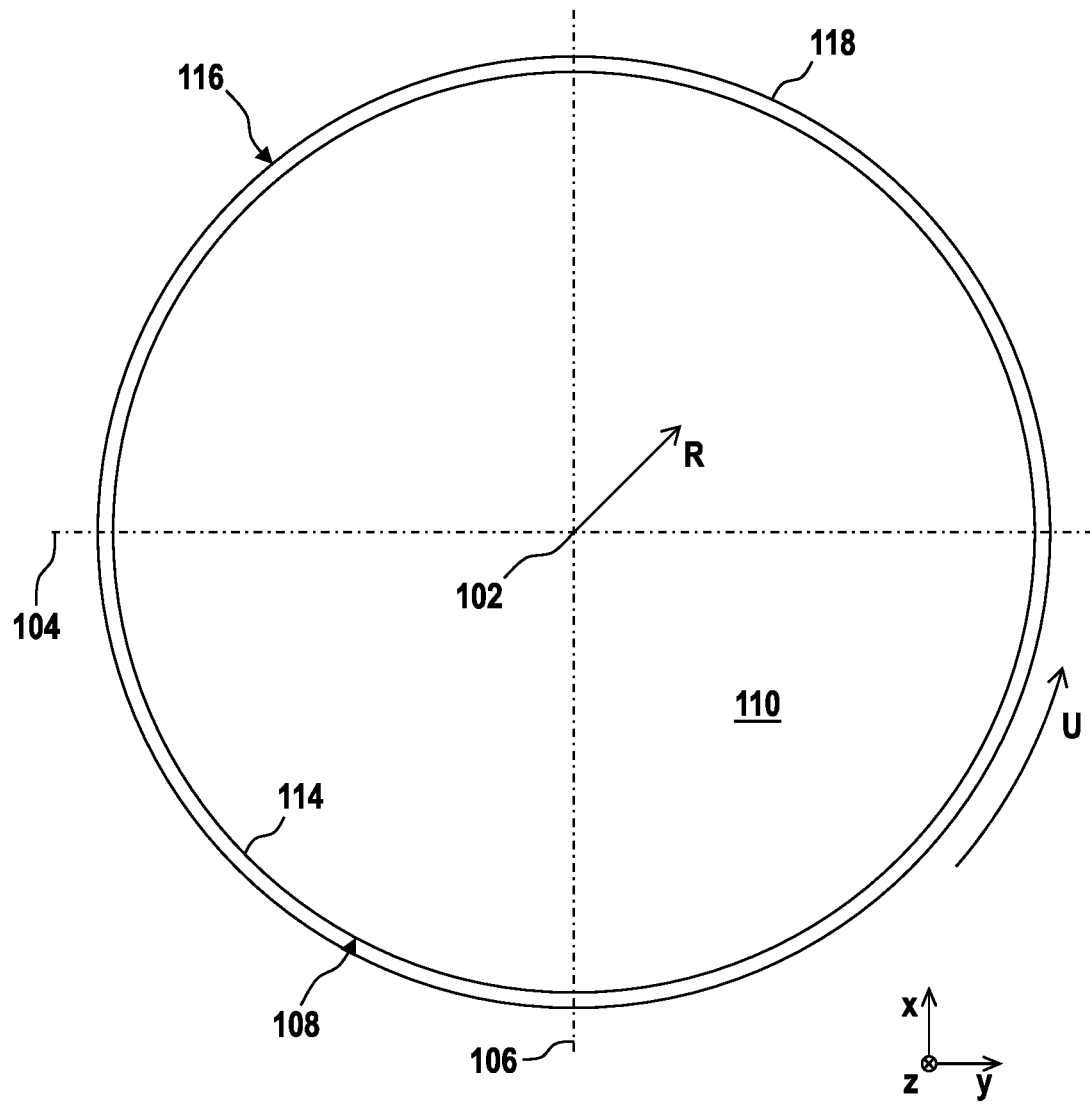
Figure 3:
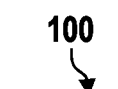
FIG. 3 shows a schematic rear view of the optical system in accordance with FIG. 2.
Figure 3:
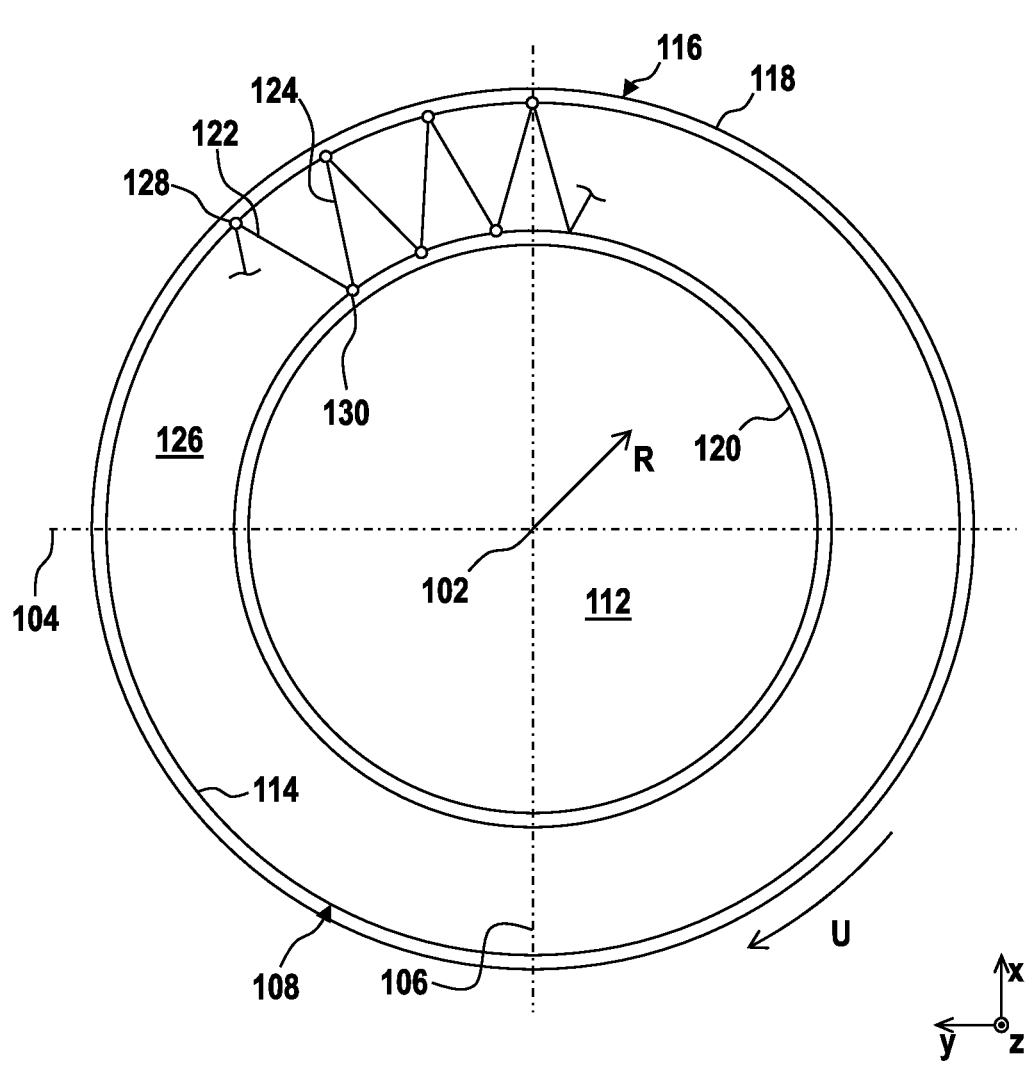
Figure 4:
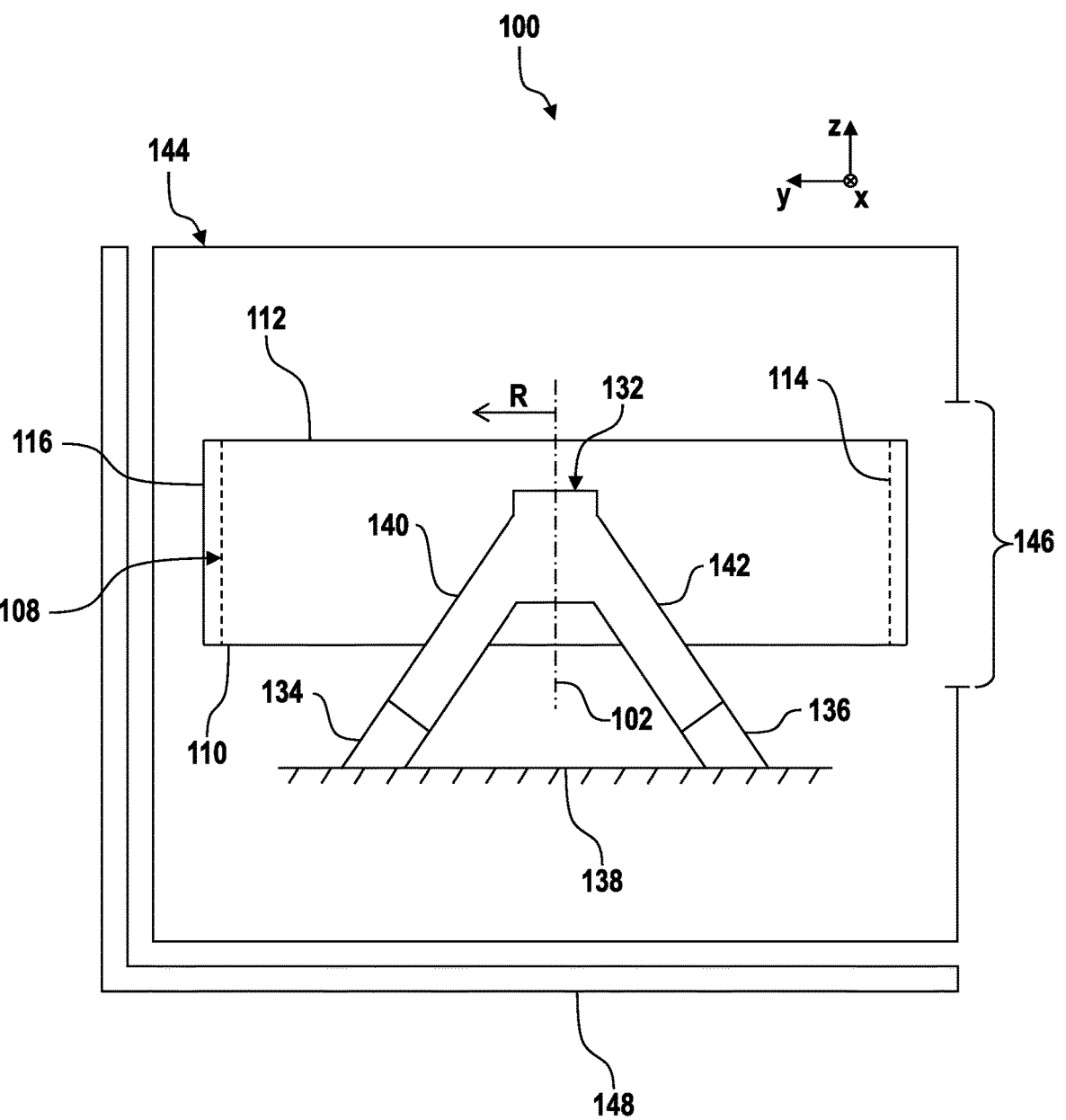
FIG. 4 shows a schematic side view of the optical system in accordance with FIG. 2.

FIG. 2 shows a schematic plan view of an embodiment of an optical system 100 for the projection exposure apparatus 1. FIG. 3 shows a schematic rear view of the optical system 100. FIG. 4 shows a schematic side view of the optical system 100. Reference is made below to FIGS. 2 to 4 simultaneously.

The optical system 100 can be part of a projection optical unit 4 as explained above. However, the optical system 100 can also be part of a beam-shaping and illumination system 2 as previously mentioned. However, it is assumed below that the optical system 100 is part of a projection optical unit 4 of this type. The optical system 100 is suitable for DUV lithography. However, the optical system 100 can also be suitable for EUV lithography.

The optical system 100 can be one of the mirrors 20, 22. The optical system 100 can accordingly be a mirror or a mirror module or may be referred to as such. For example, the optical system 100 can be a DUV mirror or may be referred to as such. The optical system 100 is optionally what is referred to as a Half Dome Mirror (HDM). The optical system 100 can be assigned the coordinate system comprising the x direction x, the y direction y and the z direction z. The x direction may also be referred to as an x axis, the y direction may also be referred to as a y axis, and the z direction may also be referred to as a z axis.

The optical system 100 has an axis of symmetry or centre axis 102 which is oriented parallel to the z direction z or coincides therewith. The optical system 100 can be constructed to be substantially rotationally symmetrical with respect to the centre axis 102. The optical system 100 is assigned two half axes 104, 106 which intersect the centre axis 102. A radial direction R of the optical system 100 is oriented perpendicularly to the centre axis 102 and away from the latter. A circumferential direction U is oriented about the centre axis 102.

The optical system 100 is swappable. That is to say that the optical system 100 can be removed from the projection optical unit 4 explained and inserted again into the latter. For this purpose, a corresponding swapping tool (not shown) can be provided. The optical system 100 can be swapped "in the field", that is to say directly at the operating location of the projection exposure apparatus 1.

The optical system 100 has an optical element 108. The optical element 108 can be a mirror or a lens element. It is assumed below that the optical element 108 is a mirror. The optical element 108 has an optically effective surface 110. The optically effective surface 110 is suitable for reflecting illumination radiation, for example the previously mentioned radiation 8, during the operation of the optical system 100. The optically effective surface 110 is a mirror surface. The optically effective surface 110 can be realized with the aid of a coating.

The optical element 108 has a rear side 112 facing away from the optically effective surface 110. The rear side 112 does not have defined surface properties. That is to say for example that the rear side 112 is not a mirror surface and therefore also does not have reflective properties. An outer surface 114 of the optical element 108 is provided between the optically effective surface 110 and the rear side 112. The outer surface 114 can be cylindrical. The outer surface 114 can be constructed rotationally symmetrically with respect to the centre axis 102.

In addition to the optical element 108, the optical system 100 has a mount 116 which carries the optical element 108. The mount 116 has an outer ring 118 and an inner ring 120. The circumferential direction U runs along the outer ring 118. The outer ring 118 and the inner ring 120 can each be constructed rotationally symmetrically with respect to the centre axis 102. As viewed along the radial direction R, the inner ring 120 is arranged within the outer ring 118 or the outer ring 118 is arranged outside the inner ring 120. The outer ring 118 and the inner ring 120 can each have a hollow-cylindrical or a tubular geometry.

The outer ring 118 is connected to the optical element 108, for example to the outer surface 114. For this purpose, a cohesive connection can be provided. In cohesive connections, the connection partners are held together by atomic or molecular forces. Cohesive connections are non-releasable connections that can be separated only by destruction of the connection mechanism and/or the connection partners. A cohesive connection may be implemented by adhesive bonding, for example. That is to say that the outer ring 118 can be adhesively bonded to the optical element 108, for example to the outer surface 114.

The inner ring 120 is not connected to the optical element 108. In the orientation of FIG. 3, the inner ring 120 is arranged above the rear side 112 of the optical element 108, but does not contact the rear side. That is to say that an air gap can be provided between the rear side 112 and the inner ring 120.

The inner ring 120 is connected to the outer ring 118 with the aid of stiffening webs or stiffening ribs 122, 124, of which only two are provided with a reference sign. The stiffening ribs 122, 124 are therefore arranged between the inner ring 120 and the outer ring 118, as viewed along the radial direction R, and span an interspace 126 provided between the outer ring 118 and the inner ring 120. The number of the stiffening ribs 122, 124 is arbitrary in principle. The stiffening ribs 122, 124 run obliquely between the outer ring 118 and the inner ring 120. The stiffening ribs 122, 124 run completely around the centre axis 102.

In each case two stiffening ribs 122, 124 are connected to the outer ring 118 at an outer or the first connection point 128. Accordingly, in each case two stiffening ribs 122, 124 are connected to the inner ring 120 at an inner or the second connection point 130. That is to say that in each case two stiffening ribs 122, 124 meet at the outer connection point 128 and in each case two stiffening ribs 122, 124 meet at the inner connection point 130.

The mount 116 is a one-piece component, for example one which is materially in one piece. "In one piece" or "integrally" here means in particular that the mount 116 is not composed of different subordinate components, but rather that the outer ring 118, the inner ring 120 and the stiffening ribs 122, 124 form a common component, namely the mount 116. "Materially in one piece" means here in particular that the mount 116 is produced from the same material throughout. For example, the mount 116 can be produced from copper, aluminium, steel or the like. The mount 116 can be produced with the aid of an additive or generative production method, for example with the aid of a 3D printing method. Furthermore, the mount 116 can also be produced with the aid of an erosion method.

As FIG. 4 shows, mount struts 132, of which only one is shown in FIG. 4, are attached to the mount 116. The mount struts 132 are referred to as "A struts" or may be referred to as such. Precisely three mount struts 132 which are offset by 120° to one another can be provided. The optical system 100 is assigned six spatial points in the form of six frame struts 134, 136, of which only two are shown in FIG. 4.

With the aid of the frame struts 134, 136, the optical system 100 can be coupled to a fixed world in the form of a frame 138. The frame 138 can be what is referred to as a manipulator frame. Each mount strut 132 is assigned two of the frame struts 134, 136. That is to say that each mount strut 132 lies against two of the frame struts 134, 136. For this purpose, each mount strut 132 has two arm sections 140, 142. With the aid of the mount struts 132, the optical system 100 is mechanically decoupled from the frame 138. For this purpose, each mount strut 132 has joints, for example what are referred to as flexures.

The optical system 100 is accommodated within a housing 144, or lens barrel. The housing 144 can be a mirror housing or may be referred to as such. To change the optical system 100, the latter has to be removed from the housing 144. A new optical system 100 subsequently has to be inserted into the housing 144. The optical system 100 is swapped through an opening 146 provided in the housing 144. The opening 146 is closable. For this purpose, a suitable cover is provided. For construction space reasons, the opening 146 is only slightly larger in size than the optical system 100. However, when the optical system 100 is swapped, it desirably does not collide either with the frame struts 134, 136 or with the housing 144. The optical system 100 is assigned a lens top cooler (LTC) 148 which is placed outside the housing 144.

The optical system 100 or the optical element 108 has six degrees of freedom, specifically three translational degrees of freedom in each case along the first spatial direction or x direction x, the second spatial direction or y direction y, and the third spatial direction or z direction z, and also three rotational degrees of freedom each about the x direction x, the y direction y, and the z direction z. That is to say that a position and an orientation of the optical system 100 or of the optical element 108 can be determined or described with the aid of the six degrees of freedom.

The "position" of the optical system 100 or of the optical element 108 is in particular understood to mean the coordinates thereof or the coordinates of a measurement point provided on the optical system 100 with respect to the x direction x, the y direction y, and the z direction z. The "orientation" of the optical system 100 or of the optical element 108 is understood to mean in particular its tilt with respect to the three spatial directions x, y, z. That is to say that the optical system 100 or the optical element 108 can be tilted about the x direction x, the y direction y, and/or the z direction z.

This results in the six degrees of freedom for the position and the orientation of the optical system 100 or of the optical element 108. A "pose" of the optical system 100 or of the optical element 108 comprises both its position and its orientation. The term "pose" is accordingly replaceable by the wording "position and orientation", and vice versa.

Figure 5:
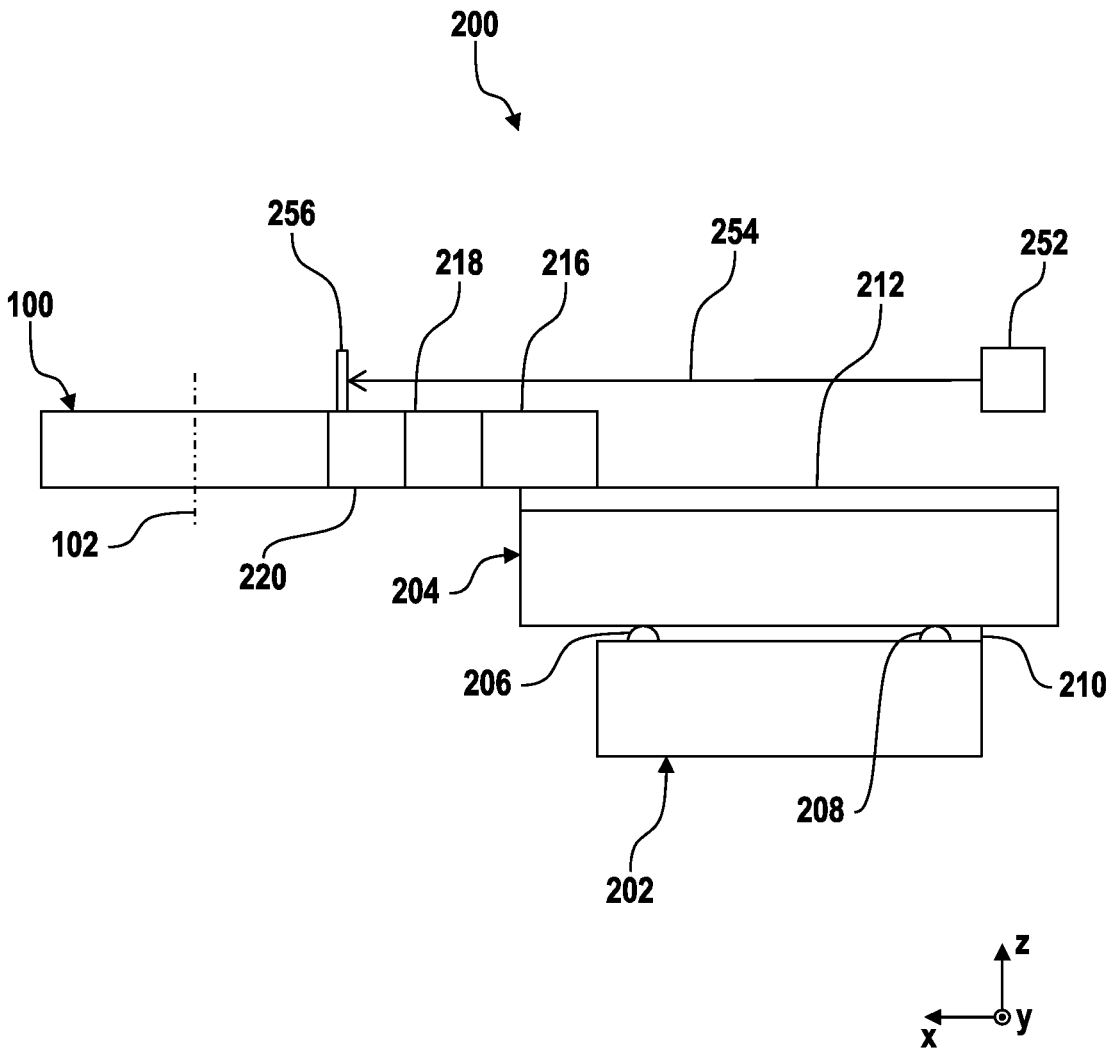
FIG. 5 shows a schematic side view of an embodiment of a swapping tool for swapping the optical system in accordance with FIG. 2.
Figure 6:
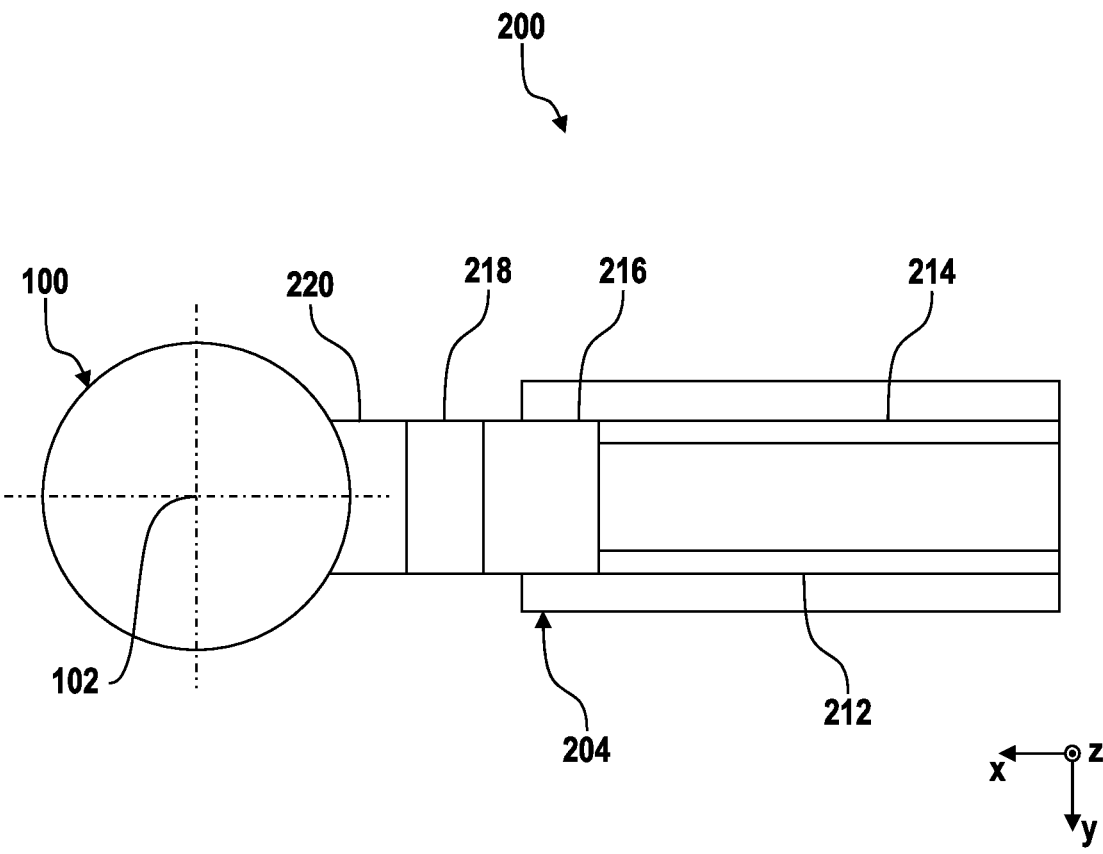
FIG. 6 shows a schematic plan view of the swapping tool in accordance with FIG. 5.

FIG. 5 shows a schematic side view of an embodiment of a swapping tool 200 for swapping the optical system 100. FIG. 6 shows a schematic plan view of the swapping tool 200. Reference is made below to FIGS. 5 and 6 simultaneously.

The swapping tool 200 has a base frame 202. The base frame 202 is coupled to a fixed world and thus forms a fixed connection with the surroundings of the projection optical unit 4. In addition to the base frame 202, an x frame 204 is provided. The x frame 204 is mounted on the base frame 202 in a manner free from torque with the aid of ball supports 206, 208 of the base frame 202 and is connected to the base frame via a leaf spring 210.

The x frame 204 has two linear guides 212, 214 which run along the x direction x. The linear guides 212, 214 can be guide rails which are arranged spaced apart from each other along the y direction y and run parallel to each other.

An xyz carrier 216 is mounted displaceably along the x direction x on the linear guides 212, 214. The xyz carrier 216 can be moved along the x direction x with the aid of the linear guides 212, 214. The linear guides 212, 214 aligned highly precisely on the x frame 204 in conjunction with the xyz carrier 216 predetermine a swapping direction and thus partly a possible positional deviation along the x direction x and the y direction y of the swapped optical system 100 in the projection optical unit 4 after finishing of the swapping process.

An rz carrier 218 is mounted on the xyz carrier 216. The rz carrier 218 permits rotation of the optical system 100 about the centre axis 102 or about the z direction z. The rz carrier 218 takes on the tasks of receiving the optical system 100 and rotating same about the centre axis 102. The optical system 100 is coupled to the swapping tool 200 with the aid of an adapter block 220 which is screwed to the mount 116. The adapter block 220 has a plurality of sensors as will also be explained later on.

The rz carrier 218 has a clamping device, also explained later on, with the aid of which the adapter block 220 can be gripped by the rz carrier 218. To minimize sagging and possible shock loadings of the optical system 100 carried by the swapping tool 200, the clamping device comprises a plurality of leaf springs which are oriented in the direction of a centre of gravity of the optical system 100.

For an optimum result when swapping the optical system 100, the previously mentioned individual component parts of the swapping tool 200, namely the base frame 202, the x frame 204, the xyz carrier 216, the rz carrier 218 and the adapter block 220 have to be aligned with respect to one another. In addition, the position of the optical system 100 has to be known at all times.

For the alignment and for detecting the position, additional sensors in the form of confocal and triangulation sensors and an autocollimator are therefore used. An incorrect alignment operation may lead to collisions of the optical system 100 with its surroundings. In the worst case, this may lead to the optical system 100 being defective. It is desirable for this to be avoided.

So that the swapped optical system 100 can be placed on the frame struts 134, 136 as far as possible without parasitic effects, a first placing operation and a second placing operation following the first placing operation can be carried out. During the first placing operation, the optical system 100 is placed with its mount struts 132 on the frame struts 134, 136. The clamping connection between the rz carrier 218 and the adapter block 220 is subsequently released such that the mount struts 132 can slide through and be positioned.

The clamping connection between the rz carrier 218 and the adapter block 220 is subsequently restored and the mount struts 132 are raised by approximately 2 mm along the z direction from the frame struts 134, 136 with the aid of the xyz carrier 216 so that possible stresses which are frozen in the joints of the mount struts 132 can relax. After the two-stage process, the subsequent placing again of the optical system 100 is performed with better accuracy.

Figure 7:
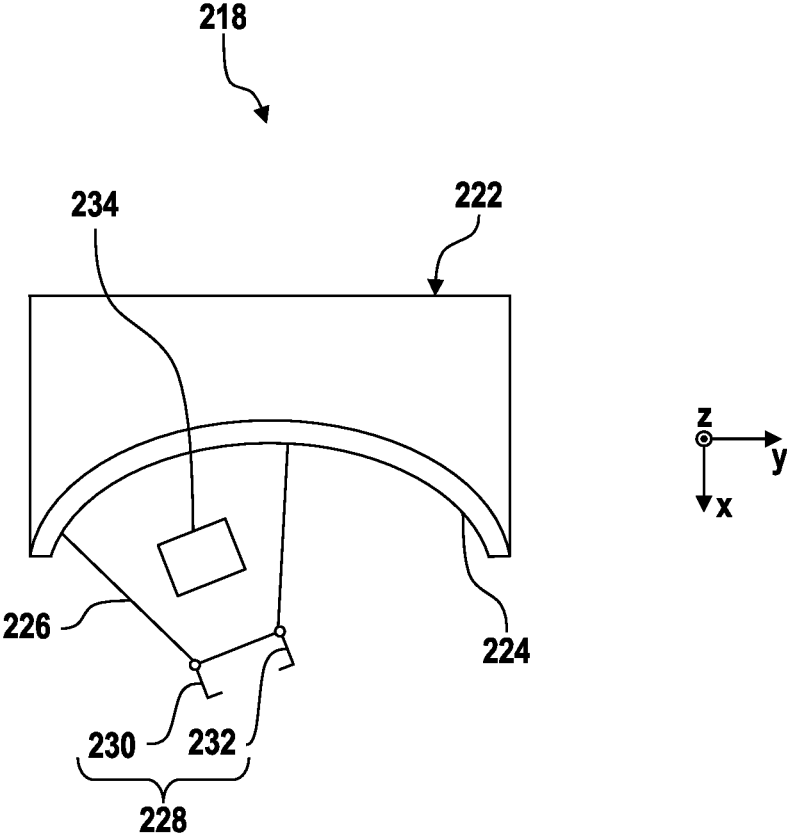
FIG. 7 shows a schematic plan view of an embodiment of an rz carrier for the swapping tool in accordance with FIG. 5.

FIG. 7 shows a schematic plan view of an embodiment of the rz carrier 218.

The rz carrier 218 comprises a base body 222 which is connected to the xyz carrier 216. Guide rails 224 curved in the shape of circular arcs are provided on the base body 222.

Two guide rails 224 which are arranged spaced apart from each other and run parallel to each other, as viewed along the z direction z, are desirably provided.

A connection body 226 is mounted displaceably on the guide rails 224. The connection body 226 can be shifted along the guide rails 224 in order to pivot the connection body about the z direction z. A clamping device 228, as previously mentioned, with two clamping arms 230, 232 is provided on the connection body 226. The clamping arms 230, 232 are mounted pivotably on the connection body 226. The rz carrier 218 can be connected releasably to the adapter block 220 with the aid of the clamping device 228.

A linear movement of the optical system 100 along the x, y and z directions and a rotational movement in each case about the x direction x, the z direction z and the y direction y are possible with the aid of the swapping tool 200. In order to improve the adjustability about the y direction y, an actuator 234 can be provided which makes it possible to tilt the clamping arms 230, 232 in relation to the connection body 226 about the y direction y. The mount struts 132 can be less loaded, as a result of which also fewer parasitic forces are introduced into the optical element 108. Since the tolerances and other adapted parameters of the optical system 100 to be swapped are known, a coordinated installation of the optical system 100 can be undertaken.

Figure 8:
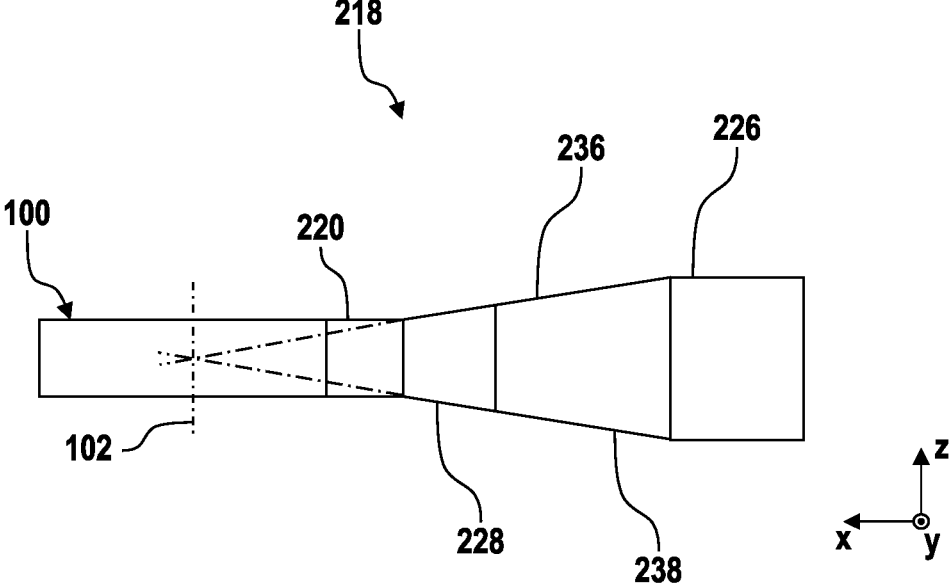
FIG. 8 shows a schematic side view of a further embodiment of an rz carrier for the swapping tool in accordance with FIG. 5.

FIG. 8 shows a schematic view of a further embodiment of the rz carrier 218.

In this embodiment of the rz carrier 218, leaf springs 236, 238 are provided instead of the actuator 234. The leaf springs 236, 238 are arranged in such a manner that extensions of the leaf springs 236, 238 intersect at a centre of gravity of the optical system 100. In comparison to a static system relating to the tiltability about the y direction y, the swapping tool 200 is more flexible and reduces parasitic effects.

Rotation of the clamping arms 230, 232, which hold the adapter block 220, about the y direction y is therefore also possible. The swapping tool 200 makes it possible to hold the optical system 100 in position even with a long lever arm. A consistent rigidity of the swapping tool 200 can be obtained. The reproducibility of the adjustment can be undertaken in the micrometer range. Overloading of the mount struts 132 is prevented. Subsequent measurement steps and adjustment steps can be spared.

A procedure for swapping the optical system 100 is explained below. As shown in FIG. 4, an optical system 100 which is to be swapped is located within the housing 144. The installation of the swapping tool 200 is an essential part of the swapping operation since it comprises a plurality of alignment and measurement steps.

Figure 9:
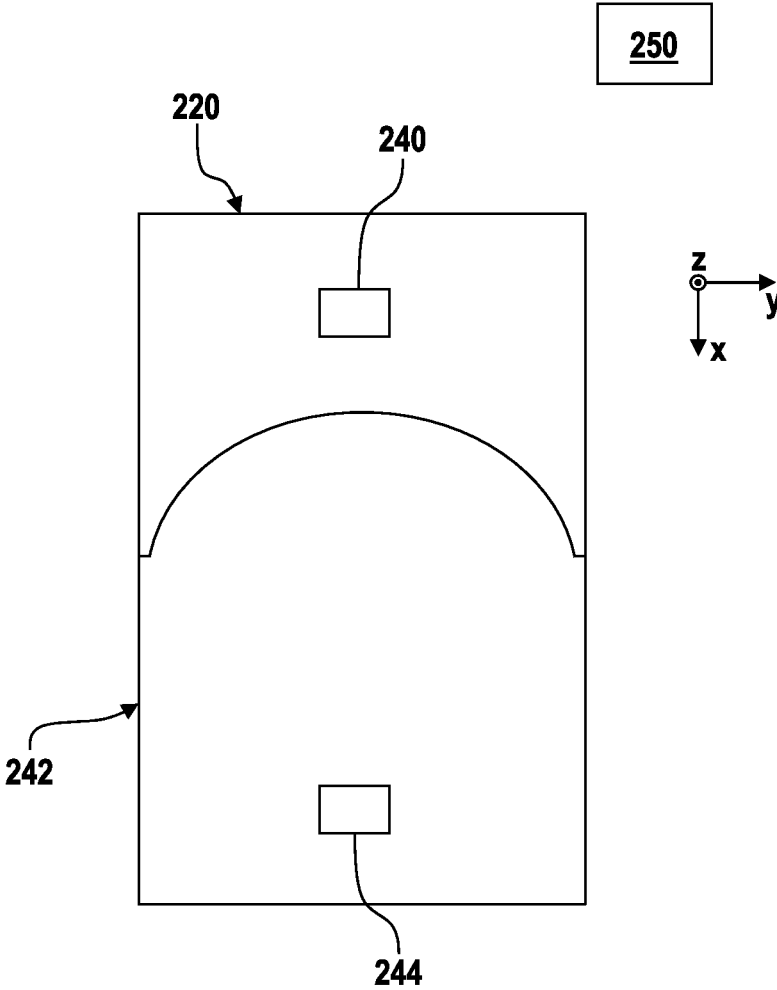
FIG. 9 shows a schematic plan view of an embodiment of an adapter block for the swapping tool in accordance with FIG. 5.

First of all, as shown in FIG. 9, sensors 240 of the adapter block 220 are calibrated. The adapter block 220 can have any desired number of sensors 240. For this purpose, the adapter block 220 is mounted on a calibration block 242. The calibration block 242 comprises a plurality of sensor targets 244 for the sensors 240. The sensor targets 244 can be mirrors.

Figure 10:
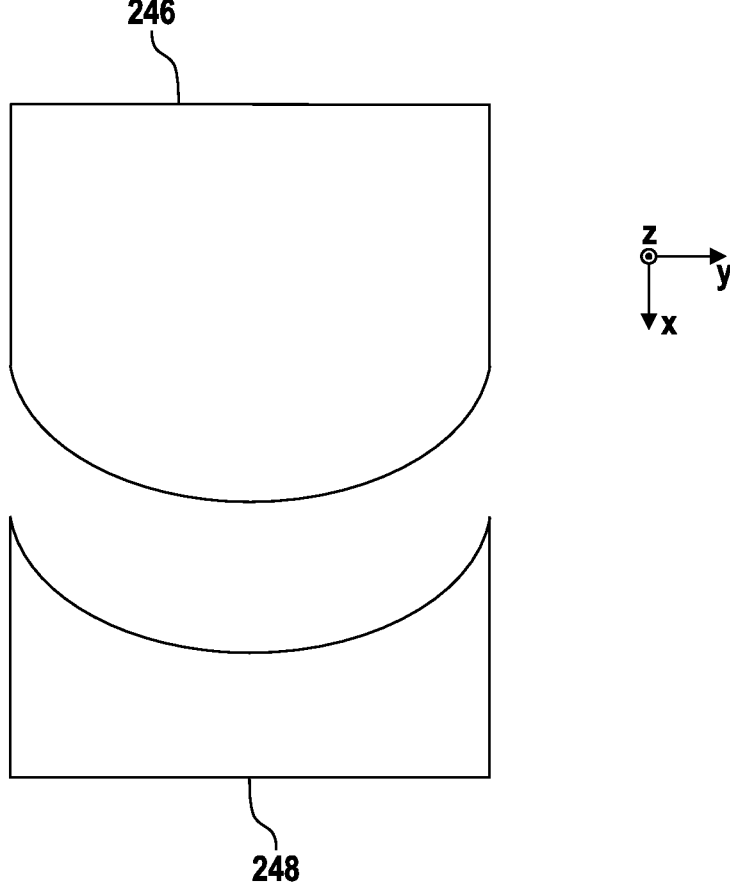
FIG. 10 shows a schematic view of an embodiment of a Lens Top Cooler Interface (LTCi) for the optical system in accordance with FIG. 2.

FIG. 10 shows a schematic view of an embodiment of a Lens Top Cooler interface 246 (LTCi).

The LTCi 246 is a component part which couples the swapping tool 200 to the Lens Top Cooler (LTC) 148 via the x frame 204 (FIG. 4). Accordingly, the LTCi 246 is firstly mounted. The LTCi 246 permits positioning of the x frame 204 in the three translational degrees of freedom along the x, y and z directions, the respective rotational degree of freedom about the x and z directions, and an alignment of the rotational degree of freedom about the y direction y.

Firstly, the LTCi 246 is mounted loosely on the LTC 148. An alignment tool 248 is mounted on the LTCi 246. The LTCi 246 is aligned with the aid of the alignment tool 248. The positioning of the LTCi 246 is improved with the aid of the alignment tool 248. When the LTCi 246 is aligned, the LTCi 246 can be fixedly connected to the LTC 148. The alignment tool 248 is then removed.

The next step comprises the adapter block 220 being mounted on the optical system 100. For example, the adapter block 220 is screwed to suitable interfaces of the mount 116 of the optical system 100. The adapter block 220 comprises six sensors 240 to detect the pose of the optical system 100.

Before the adapter block 220 is mounted on the optical system 100, the adapter block 220, as explained previously with respect to FIG. 9, is connected to the calibration block 242. The calibration block 242 has the same sensor targets 244 as the frame 138. The calibration block 242 serves to test and/or to calibrate the sensors 240 of the adapter block 220. The sensors 240 are assigned an evaluation unit 250 (FIG. 9) for evaluating sensor signals of the sensors 240. The evaluation unit 250 can be operatively connected to the sensors 240 only when the adapter block 220 is mounted on the mount 116. To test the sensors 240, the evaluation unit 250 does not absolutely have to be connected to the sensors 240. The position of the sensors 240 can be detected and optionally adjusted. The position is subsequently stored.

Before the adapter block 220 is mounted on the optical system 100, a carrying plate is first of all mounted. The carrying plate acts as a weight support and simplifies a pre-alignment of the adapter block 220. The adapter block 220 is placed on the carrying plate and moved in the direction of the optical system 100. The carrying plate aligns the adapter block 220 such that the latter is aligned with respect to the interface provided for the adapter block 220 on the optical system 100. The interface comprises three threaded bores with the aid of which the adapter block 220 is screwed to the optical system 100. The carrying plate can then be removed. The sensors 240 are connected to the evaluation unit 250.

In a next step, the base frame 202 is integrated. The base frame 202 has interfaces to a fixed world in the form of an existing structure. This fixed world supports the base frame 202 and therefore also the entire swapping tool 200. The base frame 202 also permits an adjustment of the x frame 204 about the y direction y and ensures a translational adjustability along the x, y and z directions and tilting about the z direction z during the installation of the x frame 204.

The x frame 204, the xyz carrier 216 and the rz carrier 218 are then placed on the base frame 202. The xyz carrier 216 and the rz carrier 218 are already mounted on the x frame 204 when the latter is placed on the ball supports 206, 208 of the base frame 202. The x frame 204 is moved towards the LTCi 246 until pre-alignment pins are found. The base frame 202 is then lowered at the front to find the corresponding alignment pins.

The front ball support 208 is lowered until the x frame 204 no longer has contact therewith. The x frame 204 is then screwed manually to the LTCi 246. At this time, the alignment about the y direction y is not yet completed since a precise adjustment is undertaken later. During the entire swapping operation, a front end of the base frame 202 is placed lower than a rear end of same.

To correct the tilting about the y direction y, an autocollimator 252 (FIG. 5) is provided. The desirable property for correct alignment is tilting about the y direction y of 0.3 mrad. The reason for this is that tilting about the y direction y during the swapping of the optical system 100 results in a movement along the z direction z. Since the available distance along the z direction z between the optical system 100 and an edge of the opening 146 is only a few millimetres, it is desirable that a misalignment about the y direction y is not be too great.

The xyz carrier 216 is moved to the left in the orientation of FIG. 5. The autocollimator 252 is then placed on the x frame 204. The autocollimator 252 measures the tilting of the x frame 204 about the y direction y. The autocollimator 252 sends a light beam 254 to a sensor target 256 which is attached to the adapter block 220. The sensor target 256 can be a mirror. The sensor target 256 reflects the light beam 254 back to the autocollimator 252. The misalignment of the x frame 204 can be determined by a directional difference of the outgoing and the incoming light.

The tilting error about the y direction y can be corrected with the aid of the ball supports 206, 208 until the desired accuracy of 0.3 mrad is reached. The remaining screw connections are tightened and the ball supports 206, 208 are moved away downwards from the x frame 204. The x frame 204 is then connected to the base frame 202 with the aid of the leaf spring 210.

The optical system 100 can be connected to the frame 138 with the aid of clamps. The clamps have to be opened before the optical system 100 can be swapped. Before the clamps are opened, the sensors are set to zero while the clamps are closed. To assist the opening process, clamp modules, namely a Middle Clamp Module, MCM, a Left Clamp Module, LCM and a Right Clamp Module, RCM, are provided.

The steps are carried out as follows. Mounting of the middle clamp module, unlocking of the clamp, opening of the clamp, locking of the clamp and removal of the middle clamp module. The left clamp module and the right clamp module are not removed. The left clamp module and the right clamp module are merely opened and locked in their open state. After all three clamps have been opened, the sensors are set to zero again. The clamp modules may also be referred to as lens clamps.

Before the clamps can be connected to leaf springs, the translational directions x and y and the rotational z direction z of the rz carrier 218 with respect to the leaf springs have to be measured and adapted. A careful alignment in the translational directions x and y and in the rotational direction z is desirable for several reasons. Firstly, the pivot point of the guide rails 224 has to coincide with the centre axis 102 of the optical system 100. If this is not the case, parasitic movements may occur during the swapping of the optical system 100, which may lead to a collision. Furthermore, a collision between the clamps and the leaf springs should be prevented. Springing back should be minimized.

Figure 11:
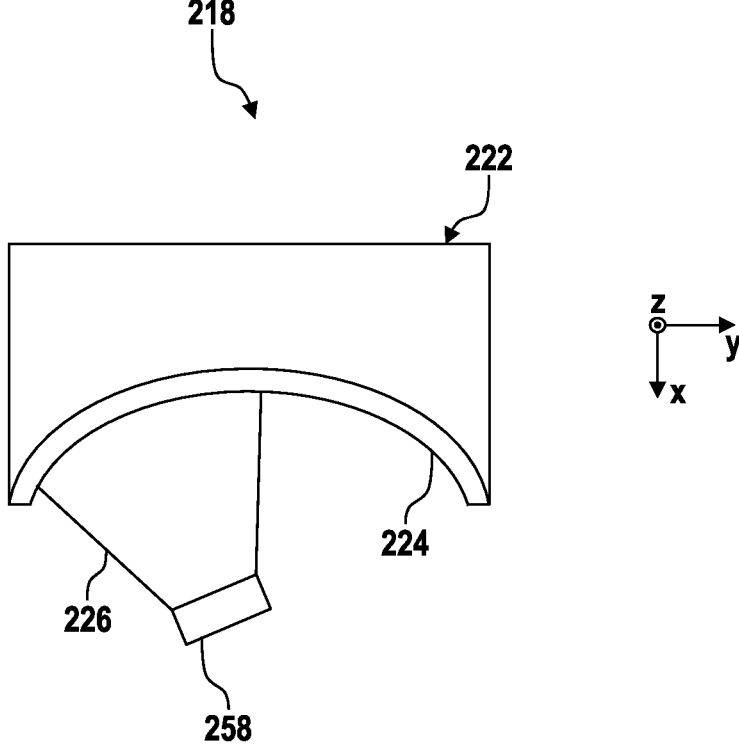
FIG. 11 shows a further schematic plan view of the rz carrier in accordance with FIG. 7.

A tool 258 (FIG. 11) can be provided for this purpose. The tool 258 comprises a sensor bracket and a reference. The reference is used similarly as with the adapter block 220 and the calibration block 242 to set sensors of the sensor bracket to zero. The sensor bracket comprises three sensors, namely two for measuring the x direction x and one for measuring the y direction y. The rotation about the z direction z can thus also be determined. The desired alignment accuracy for the translation along the x direction x is 100 μm, for the translation along the y direction y is 300 μm and for the rotation about the z direction z is 0.5 μrad. All three directions x, y and z can be corrected at the rz carrier 218.

Subsequently, the xyz carrier 216 is shifted along the x direction x into its zero position. For this purpose, a damper can be provided which runs against an end stop. The adapter block 220 is positioned and the cables of the sensors 240 of the adapter block 220 are manually connected. When the adapter block 220 is positioned, it can be screwed to the mount 116. The clamp modules are still closed in this case. This prevents displacement of a zero position. By contrast, the clamping device 228 is initially open after the adapter block 220 is connected to the mount 116. The clamping device 228 is finally closed. The optical system 100 is now ready for swapping.

Before the optical system 100 can be pulled out of the housing 144, the optical system 100 has to be rotated such that the mount struts 132 do not collide with the frame struts 134, 136. The optical system 100 is therefore taken out of the housing 144 in three steps. First of all, the optical system 100 is raised by 10 mm along the z direction z. The raising can be checked with the aid of sensors. With the aid of the rz carrier 218, the optical system 100 is rotated by −43.5°. The guide rail 224 is subsequently locked. The optical system 100 is then lowered again along the z direction z to a height of 0.7 mm. This can also be checked with the aid of sensors.

The aforementioned steps move the optical system 100 into a pose in which the optical system 100 can be safely moved out of the housing 144. The xyz carrier 216 is moved away from the housing 144 along the linear guides 212, 214 and locked. Lifting lugs can be mounted on the optical system 100 and the adapter block 220 can be released from the optical system 100. The optical system 100 can be lifted from the swapping tool 200 and temporarily stored.

A transport box in which a further optical system 100 is located can be opened and a connection between the optical system 100 and the transport box can be opened. After a visual inspection of the optical system 100, the lifting lugs are installed. The optical system 100 is moved to the swapping tool 200 and the optical system 100 is mounted on the adapter block 220. The steps for installing the optical system 100 are carried out as previously explained, but in a reverse sequence.

However, the completion of the installation differs slightly from the removal. After the detection region of the sensors is reached, the optical system 100 is adjusted along the z direction z to 0 mm. To minimize bending of the mount struts 132, a second placing operation is planned. For this purpose, clamp spanners are used to open the clamps which are then immediately closed again. The optical system 100 is then raised and placed again onto the frame struts 134, 136. The procedure corresponds to the first placing operation. Subsequently, the clamp spanners are inserted again into the rz carrier 218 to open the clamps. The rz carrier 218 can then be moved out.

Figure 12:
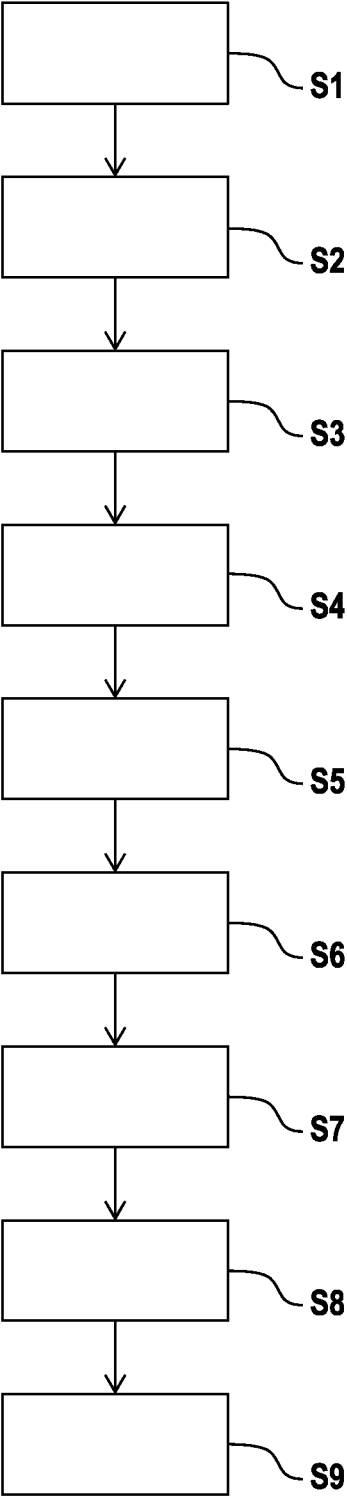
FIG. 12 shows a schematic block diagram of an embodiment of a method for swapping the optical system in accordance with FIG. 2.

FIG. 12 shows a schematic block diagram of an embodiment of a method for swapping the optical system 100.

The method is carried out with the aid of the previously explained swapping tool 200. The method comprises a step S1 of raising the optical system 100 along the centre axis 102 in such a manner that the mount struts 132 of the optical system 100 pass out of contact with frame struts 134, 136 of the frame 138 carrying the optical system 100. That is to say that the mount struts 132 are lifted off the frame struts 134, 136.

In a step S2, the optical system 100 is rotated about the centre axis 102 in such a manner that the mount struts 132 are arranged between the frame struts 134, 136. In a step S3, the optical system 100 is lowered along the centre axis 102. A step S4 comprises shifting the optical system 100 perpendicularly to the centre axis 102 in such a manner that the optical system 100 is moved out of the housing 144.

During step S3, the optical system 100 can be lowered to such an extent that the optical system 100 is arranged, as viewed along the centre axis 102, in a position which differs from a position of the optical system 100 before step S1.

The method can furthermore comprise a step S5 of swapping the optical system 100 for a further optical system 100. The optical system 100 and the further optical system 100 are optionally not structurally identical. The further optical system 100 may also be referred to as an optical swapping system, optical change system or optical change component part.

This further optical system 100 is optionally not structurally identical to the optical system 100 first mentioned. The optical system 100 can be an sHDM or static or solid Half Dome Mirror which is swapped for the further optical system in the form of a dHDM or deformable Half Dome Mirror. That is to say that the further optical system 100 which is integrated in the housing 144 can have component parts which the optical system 100 mentioned first does not have. However, at least the mounts 116 and/or the mount struts 132 of the optical system 100 and of the further optical system 100 can be structurally identical or identical. However, it is also possible for a dHDM to be swapped for another dHDM. In this last-mentioned case, the optical system 100 and the further optical system 100 are actually structurally identical.

In a step S6, the further optical system 100 is shifted perpendicularly to the centre axis 102 in such a manner that the further optical system 100 is moved into the housing 144. A step S7 comprises raising the further optical system 100 along the centre axis 102 or along the z direction z.

In a step S8, the further optical system 100 is rotated about the centre axis 102 in such a manner that mount struts 132 of the further optical system 100 are arranged above the frame struts 134, 136. Subsequently, in a step S9, the further optical system 100 is lowered along the centre axis 102 in such a manner that the mount struts 132 enter into contact with the frame struts 134, 136. That is to say that the mount struts 132 are lowered onto the frame struts 134, 136.

After step S9, the further optical system 100 can be raised along the centre axis 102 in such a manner that the mount struts 132 pass out of contact with the frame struts 134, 136. Subsequently, the further optical system 100 is lowered along the centre axis 102 or counter to the z direction z in such a manner that the mount struts 132 enter into contact again with the frame struts 134, 136. The mount struts 132 are therefore placed on the frame struts 134, 136.

After step S9 and before the further optical system 100 is raised, a connection between the further optical system 100 and the swapping tool 200 can be released such that the mount struts 132 are automatically positioned on the frame struts 134, 136. For this purpose, the clamping device 228 is opened. For example, the connection between the further optical system 100 and the swapping tool 200 is restored before the further optical system 100 is raised. For this purpose, the clamping device 228 is closed again.

Before step S1, the pose of the optical system 100 is detected, wherein the detected pose of the optical system 100 is transmitted to the further optical system 100 before step S5. Before step S9, the pose of the further optical system 100 can be adjusted with the aid of the swapping tool 200.

Although the present disclosure has been described with reference to exemplary embodiments, it is modifiable in various ways.

LIST OF REFERENCE SIGNS

1 Projection exposure apparatus
2 Beam-shaping and illumination system
4 Projection optical unit
6 Light source
8 Radiation
10 Photomask
12 Wafer
14 Lens element
16 Lens element
18 Lens element
20 Mirror
22 Mirror
24 Optical axis
26 Medium
100 Optical system/HDM
102 Centre axis
104 Half axis
106 Half axis
108 Optical element
110 Optically effective surface
112 Rear side
114 Outer surface
116 Mount
118 Outer ring
120 Inner ring
122 Stiffening rib
124 Stiffening rib
126 Interspace
128 Connection point
130 Connection point
132 Mount strut
134 Frame strut
136 Frame strut
138 Frame
140 Arm section
142 Arm section
144 Housing
146 Opening
148 Lens Top Cooler/LTC
200 Swapping tool
202 Base frame
204 x frame
206 Ball support
208 Ball support
210 Leaf spring
212 Linear guide
214 Linear guide
216 xyz carrier
218 rz carrier
220 Adapter block
222 Base body
224 Guide rail
226 Connection body
228 Clamping device
230 Clamping arm
232 Clamping arm
234 Actuator
236 Leaf spring 238 Leaf spring
240 Sensor
242 Calibration block
244 Sensor target
246 Lens Top Cooler interface/LTCi
248 Alignment tool
250 Evaluation unit
252 Autocollimator
254 Light beam
256 Sensor target
258 Tool
R Radial direction
S1 Step
S2 Step
S3 Step
S4 Step
S5 Step
S6 Step
S7 Step
S8 Step
S9 Step
U Circumferential direction
x x direction
y y direction
z z direction

What is claimed is:

1. A method of swapping an optical system of a projection exposure apparatus, the method comprising:
   a) raising the optical system along a centre axis of the optical system so that mount struts of the optical system lose contact with frame struts of a frame carrying the optical system;
   b) after a), rotating the optical system about the centre axis so that the mount struts are between the frame struts;
   c) after b), lowering the optical system along the centre axis; and
   d) after c), shifting the optical system perpendicularly to the centre axis so that the optical system is moved out of a housing.

2. The method of claim 1, wherein the optical system comprises a mirror.

3. The method of claim 1, wherein the optical system comprises a DUV mirror.

4. The method of claim 1, wherein, during c), the optical system is lowered so that the optical system is, as viewed along the centre axis, in a position which differs from a position of the optical system before a).

5. The method of claim 4, further comprising:
   e) after d), swapping the optical system for a further optical system;
   f) after e), shifting the further optical system perpendicularly to a centre axis of the further optical system so that the further optical system is moved into the housing;
   g) after f), raising the further optical system along the centre axis of the further optical system;
   h) after g), rotating the further optical system about the centre axis of the further optical system so that mount struts of the further optical system are above the frame struts; and
   i) after h), lowering the further optical system along the centre axis of the further optical system so that the mount struts contact the frame struts.

6. The method of claim 5, further comprising, after i):
   j) raising the further optical system along the centre axis of the further optical system so that the mount struts lose contact with the frame struts; and

k) after j), lowering the further optical system along the centre axis of the further optical system so that the mount struts contact the frame struts.

7. The method of claim 6, further comprising, after i) and before j), releasing a connection between the optical system and a swapping tool so that the mount struts are automatically positioned on the frame struts.

8. The method of claim 7, further comprising restoring the connection between the further optical system and the swapping tool raising the further optical system.

9. The method of claim 8, further comprising:

before a), detecting a pose of the optical system is detected; and before e), transmitting the detected pose of the optical system to the further optical system.

10. The method of claim 9, further comprising, before i), using the swapping tool to adjust the pose of the further optical system.

11. The method of claim 7, further comprising:

before a), detecting a pose of the optical system is detected; and before e), transmitting the detected pose of the optical system to the further optical system.

12. The method of claim 1, further comprising:

e) after d), swapping the optical system for a further optical system;

f) after e), shifting the further optical system perpendicularly to a centre axis of the further optical system so that the further optical system is moved into the housing;

g) after f), raising the further optical system along the centre axis of the further optical system;

h) after g), rotating the further optical system about the centre axis of the further optical system so that mount struts of the further optical system are above the frame struts; and i) after h), lowering the further optical system along the centre axis of the further optical system so that the mount struts contact the frame struts.

13. A swapping tool configured to swap an optical system of a projection exposure apparatus, the swapping tool comprising:

an xyz carrier configured to raise and lower the optical system along a centre axis of the optical system;

an rz carrier configured to rotate the optical system about the centre axis; and an x frame configured to shift the optical system perpendicularly to the centre axis, wherein:

the xyz carrier is configured so that, when the xyz carrier raises the optical system along the centre axis, mount struts of the optical system lose contact with frame struts of a frame carrying the optical system;

the rz carrier is configured so that, when the mounts struts are not in contact with the frame struts and the rz carrier rotates the optical system about the centre axis, the mount struts are between the frame struts;

the xyz carrier is configured to lower the optical system along the centre axis when the mount struts are between the frame struts; and the x frame is configured so that, when the mount struts are between the frame struts, the x frame shifts the optical system perpendicularly to the optical axis to move the optical system out of a housing of the projection exposure apparatus.

14. The swapping tool of claim 13, wherein the xyz carrier and the rz carrier are configured to adjust the optical system in six degrees of freedom.

15. The swapping tool of claim 13, wherein the x frame carries the xyz carrier, and the xyz carrier carries the rz carrier.

16. The swapping tool of claim 13, further comprising an adapter block connectable to the optical system.

17. The swapping tool of claim 16, wherein the rz carrier comprises a clamping device configured to releasably connect the rz carrier to the adapter block.

18. The swapping tool of claim 17, wherein the clamping device comprises clamping arms supported on a connection body of the rz carrier via leaf springs.

19. The swapping tool of claim 18, further comprising a sensor arrangement configured to detect a pose of the optical system.

20. The swapping tool of claim 13, further comprising a sensor arrangement configured to detect a pose of the optical system.

21. An apparatus, comprising:

an optical system comprising mount struts;

a frame comprising frame struts in contact with the mount struts so that the frame carries the optical system; and a swapping tool, comprising:

an xyz carrier configured to raise and lower the optical system along a centre axis of the optical system;

an rz carrier configured to rotate the optical system about the centre axis; and an x frame configured to shift the optical system perpendicularly to the centre axis, wherein:

the xyz carrier is configured so that, when the xyz carrier raises the optical system along the centre axis, the mount struts lose contact with the frame struts;

the rz carrier is configured so that, when the mounts struts are not in contact with the frame struts and the rz carrier rotates the optical system about the centre axis, the mount struts are between the frame struts;

the xyz carrier is configured to lower the optical system along the centre axis when the mount struts are between the frame struts;

the x frame is configured so that, when the mount struts are between the frame struts, the x frame shifts the optical system perpendicularly to the optical axis to move the optical system out of a housing of the apparatus; and the apparatus is a projection exposure apparatus.

* * * * *